United States Patent
Deguchi

(10) Patent No.: US 12,532,407 B2
(45) Date of Patent: Jan. 20, 2026

(54) ELECTRONIC COMPONENT

(71) Applicant: Murata Manufacturing Co., Ltd., Kyoto-fu (JP)

(72) Inventor: Ikuo Deguchi, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 292 days.

(21) Appl. No.: 18/319,671

(22) Filed: May 18, 2023

(65) Prior Publication Data
US 2023/0292432 A1 Sep. 14, 2023

Related U.S. Application Data

(63) Continuation of application No. PCT/JP2021/042068, filed on Nov. 16, 2021.

(30) Foreign Application Priority Data

Nov. 26, 2020 (JP) .................................. 2020-195990

(51) Int. Cl.
*H05K 1/02* (2006.01)

(52) U.S. Cl.
CPC . *H05K 1/0269* (2013.01); *H05K 2201/09936* (2013.01)

(58) Field of Classification Search
CPC ... H05K 2201/09936; H05K 2203/166; H05K 2201/09918; H05K 2201/09927; H05K 1/0266; H05K 1/0268; H05K 1/0269
See application file for complete search history.

(56) References Cited

FOREIGN PATENT DOCUMENTS

| JP | 2000-091170 A | 3/2000 |
|---|---|---|
| JP | 2007-184658 A | 7/2007 |
| JP | 2011-023615 A | 2/2011 |
| JP | 2011-045908 A | 3/2011 |
| JP | 2013-229431 A | 11/2013 |
| WO | 2018/150759 A1 | 8/2018 |

OTHER PUBLICATIONS

International Search Report for PCT/JP2021/042068 dated Feb. 8, 2022.

*Primary Examiner* — Jeremy C Norris
(74) *Attorney, Agent, or Firm* — McDonald Hopkins LLC

(57) ABSTRACT

An electronic component is an electronic component including a first surface, wherein a marking formed by a collection of a plurality of dot-shaped recesses is formed in the first surface, an inner surface of each of the plurality of dot-shaped recesses is a curved surface, when viewed in a direction perpendicular to the first surface, an region internal to an outline of each of the plurality of dot-shaped recesses is entirely non-flat, the electric component comprises one or more second regions internal to an outline of the marking when viewed in the direction perpendicular to the first surface, each of the one or more second regions not belonging to any of the plurality of dot-shaped recesses, each of the one or more second regions being chamfered, each of the one or more second regions being non-flat, and each of the one or more second regions is convex.

9 Claims, 16 Drawing Sheets

ELECTRONIC COMPONENT

CROSS REFERENCE TO RELATED APPLICATION

This is a continuation of International Application No. PCT/JP2021/042068 filed on Nov. 16, 2021 which claims priority from Japanese Patent Application No. 2020-195990 filed on Nov. 26, 2020. The contents of these applications are incorporated herein by reference in their entireties.

BACKGROUND OF THE DISCLOSURE

Field of the Disclosure

The present disclosure relates to an electronic component.

Description of the Related Art

A marking for identifying an orientation, a product type, a lot number, or the like may be provided in a surface of an electronic component. Japanese Patent Laid-Open No. 2013-229431 (PTL 1) describes that a dot portion is formed by irradiating a surface of a semiconductor device with pulse laser. PTL 1 describes that a two-dimensional code is formed by a combination of the dot portion and a non-dot portion.

PTL 1: Japanese Patent Laid-Open No. 2013-229431

BRIEF SUMMARY OF THE DISCLOSURE

In general, in order to read a marking formed in a surface of a target object, the following method is employed: the target object is irradiated with light from a sensor unit and returning reflected light is detected. In the two-dimensional code formed in PTL 1, a bottom surface of a recess formed as the dot portion is a flat surface. When the surface of the semiconductor device is perpendicularly irradiated with light from the sensor in order to read the two-dimensional code, the flat surface of the bottom surface of the dot portion is orthogonal to the optical axis, with the result that substantially the whole of the irradiated light is reflected in the incident direction. In that case, the intensity of the detected reflected light is substantially the same as the intensity of reflected light obtained at a portion other than the two-dimensional code. That is, contrast is not sufficient. This may lead to a reading error.

In view of the above, a possible benefit of the present disclosure is to provide an electronic component having a marking by which contrast of reflected light can be sufficiently secured.

In order to achieve the above possible benefit, an electronic component according to the present disclosure is an electronic component including a first surface, wherein a marking formed by a collection of a plurality of dot-shaped recesses is formed in the first surface, an inner surface of each of the plurality of dot-shaped recesses is a curved surface, when viewed in a direction perpendicular to the first surface, a region internal to an outline of each of the plurality of dot-shaped recesses is entirely non-flat, the electric component comprises one or more second regions internal to an outline of the marking when viewed in the direction perpendicular to the first surface, each of the one or more second regions not belonging to any of the plurality of dot-shaped recesses, each of the one or more second regions being chamfered, each of the one or more second regions being non-flat, and each of the one or more second regions is convex.

According to the present disclosure, since the region internal to the outline of each of the plurality of dot-shaped recesses is entirely non-flat, there can be obtained an electronic component having a marking by which contrast of reflected light can be sufficiently secured.

DETAILED DESCRIPTION OF THE DISCLOSURE

A dimensional ratio shown in figures does not necessarily represent an actual dimensional ratio exactly, and may be shown in an exaggerated manner for convenience of explanation. In the description below, when reference is made to a concept regarding the upward direction or downward direction, the upward direction or downward direction is not necessarily meant in an absolute sense, but may be meant in a relative sense in an illustrated posture.

In each of below-described embodiments, the term "electronic component" is a concept that not only represents a single component such as an IC, a capacitor, or an inductor but also includes a package product formed by combining these components. For example, the term "electronic component" is also defined to include a product having a configuration in which a plurality of components are mounted on a substrate and these are sealed with a resin.

First Embodiment

Figure 1:
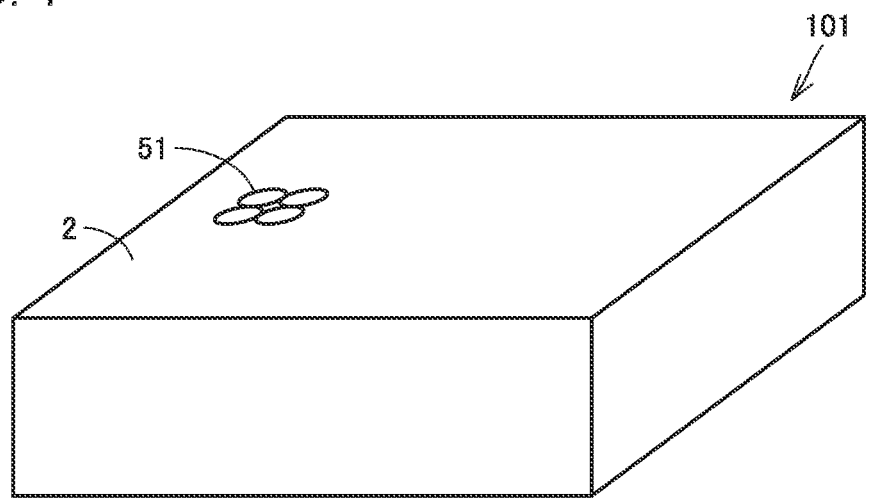
FIG. 1 is a perspective view of an electronic component according to a first embodiment of the present disclosure.

An electronic component according to a first embodiment of the present disclosure will be described with reference to FIGS. 1 to 5. FIG. 1 shows an electronic component 101 according to the present embodiment. The type and shape of the electronic component are not particularly limited; however, the electronic component illustrated herein has a rectangular parallelepiped shape as an example for convenience of explanation.

Figure 2:
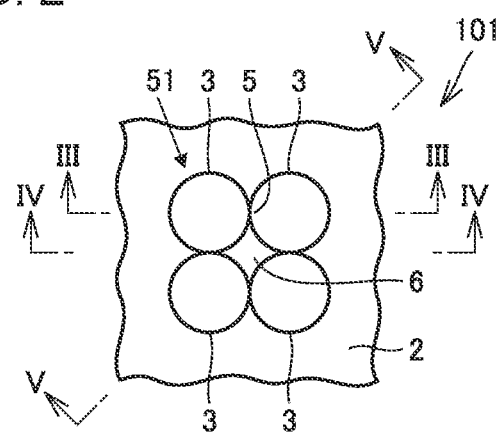
FIG. 2 is an enlarged plan view of a marking and a vicinity thereof in the electronic component according to the first embodiment of the present disclosure.

Electronic component 101 has a first surface 2. Here, as one example, the upper surface of electronic component 101 is first surface 2. A marking 51 is formed at one location of first surface 2. Marking 51 is formed by laser irradiation. The laser irradiation herein may be pulse laser irradiation. FIG. 2 shows marking 51 and a vicinity thereof in an enlarged manner. Marking 51 is formed by a plurality of dot-shaped recesses 3. Here, marking 51 is formed by 2×2 dot-shaped recesses 3, i.e., four dot-shaped recesses 3 in total; however, this is just an example and marking 51 may be formed by a larger number of dot-shaped recesses 3.

Figure 3:
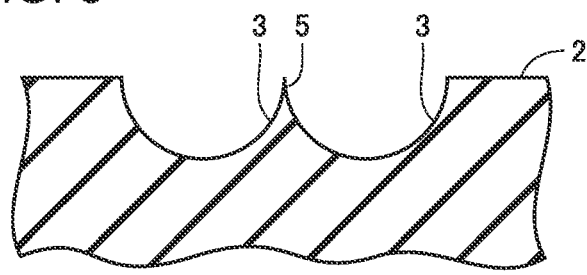
FIG. 3 is a cross sectional view taken along a line III-III in FIG. 2.
Figure 4:
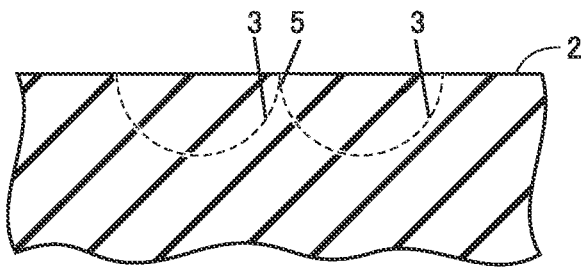
FIG. 4 is a cross sectional view taken along a line IV-IV in FIG. 2.
Figure 5:
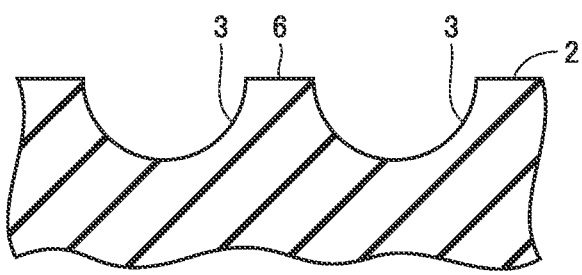
FIG. 5 is a cross sectional view taken along a line V-V in FIG. 2.

FIG. 3 is a cross sectional view taken along a line III-III in FIG. 2. FIG. 4 is a cross sectional view taken along a line IV-IV in FIG. 2. FIG. 5 is a cross sectional view taken along a line V-V in FIG. 2.

Electronic component 101 according to the present embodiment is an electronic component including a first surface 2, wherein a marking 51 formed by a collection of a plurality of dot-shaped recesses 3 are formed in first surface 2. An inner surface of each of the plurality of dot-shaped recesses 3 is a curved surface. When viewed in a direction perpendicular to first surface 2, a region internal to an outline of each of the plurality of dot-shaped recesses 3 is entirely non-flat. A wall-shaped portion 5 is located between dot-shaped recesses 3. As shown in FIG. 3, the height of the upper end of wall-shaped portion 5 is equal to the height of first surface 2. Even inside marking 51, a flat portion may be present in a region not belonging to any of dot-shaped recesses 3. For example, an unprocessed portion may remain as a plateau portion 6 shown in FIG. 2, and this portion may be flat. The region internal to the outline of each of dot-shaped recesses 3 is entirely non-flat. For example, the region is a curved surface. This curved surface is a hemispherical surface. It should be noted that the inner surface of dot-shaped recess 3 is not necessarily an exact hemispherical surface.

In the present embodiment, since the region internal to the outline of each of the plurality of dot-shaped recesses 3 is entirely non-flat, light having been emitted toward marking 51 in the direction perpendicular to first surface 2 in order to read marking 51 is reflected in a direction different from the incident direction on the side internal to the outline of each dot-shaped recess 3. Thus, a small amount of light is returned toward the reading device. In other words, an amount of reflected light greatly differs between a location in which the marking is present and a location other than the marking. Thus, according to the present embodiment, the electronic component can have a marking by which contrast of reflected light can be sufficiently secured.

As shown in the present embodiment, the plurality of dot-shaped recesses 3 are preferably arranged such that two or more dot-shaped recesses 3 are arranged in a first direction and two or more dot-shaped recesses 3 are arranged in a second direction perpendicular to the first direction. In the example shown in FIG. 2, when it is defined that the leftward/rightward direction in FIG. 2 is the first direction, the upward/downward direction in FIG. 2 is the second direction. Here, only two dot-shaped recesses 3 are arranged in each of the first direction and the second direction; however, three or more dot-shaped recesses 3 may be arranged in each of the first direction and the second direction. When forming the marking to have an elongated shape, it is preferable that dot-shaped recesses 3 are arranged in two or more rows rather than in one row.

Second Embodiment

Figure 6:
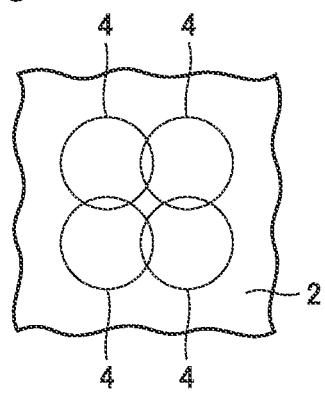
FIG. 6 is a diagram showing regions to be irradiated with laser light for obtaining an electronic component according to a second embodiment of the present disclosure.

In the first embodiment, as shown in FIG. 2, dot-shaped recesses 3 are adjacent to each other so as to circumscribe each other; however, this is just an example. For example, as shown in FIG. 6, regions 4 to be irradiated with laser light when forming the marking may partially overlap with each other.

Figure 7:
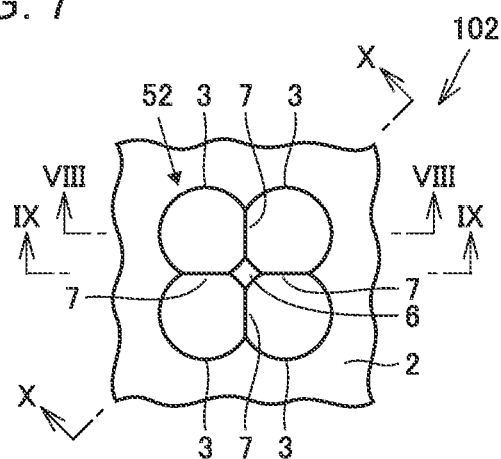
FIG. 7 is an enlarged plan view of a marking and a vicinity thereof in the electronic component according to the second embodiment of the present disclosure.
Figure 8:
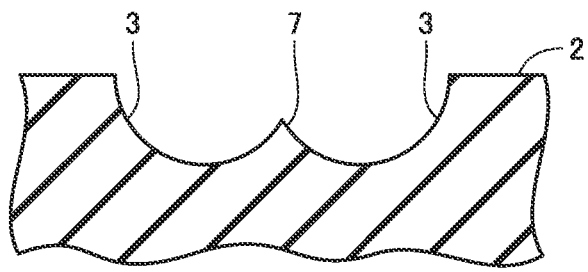
FIG. 8 is a cross sectional view taken along a line VIII-VIII in FIG. 7.
Figure 9:
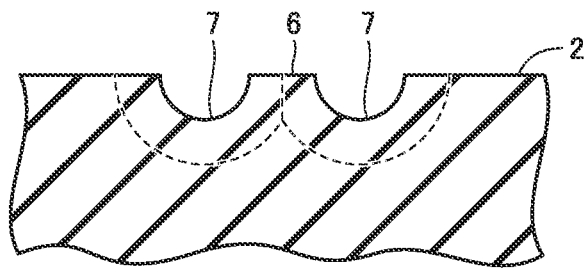
FIG. 9 is a cross sectional view taken along a line IX-IX in FIG. 7.
Figure 10:
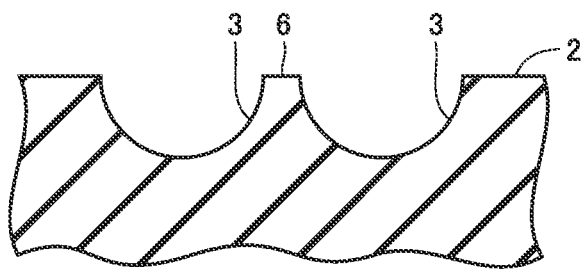
FIG. 10 is a cross sectional view taken along a line X-X in FIG. 7.

An electronic component according to a second embodiment of the present disclosure will be described with reference to FIGS. 6 to 10. FIG. 7 shows a marking 52 and a vicinity thereof in an electronic component 102 according to the present embodiment in an enlarged manner. As shown in FIG. 6, when regions 4 are irradiated with laser light and are accordingly processed, a structure as shown in FIG. 7 is obtained. FIG. 8 is a cross sectional view taken along a line VIII-VIII in FIG. 7. FIG. 9 is a cross sectional view taken along a line IX-IX in FIG. 7. FIG. 10 is a cross sectional view taken along a line X-X in FIG. 7. A mountain portion 7 is formed at a boundary portion between dot-shaped recesses 3. The upper end of mountain portion 7 is located at a position lower than first surface 2. The other configurations are the same as those described in the first embodiment, and therefore will not be described repeatedly.

In the present embodiment, the plurality of dot-shaped recesses 3 that form marking 52 are in a connected state; however, since the region internal to the outline of each of the plurality of dot-shaped recesses 3 is entirely non-flat, light having been emitted toward marking 52 in the direction perpendicular to first surface 2 in order to read marking 52 is reflected in a direction different from the incident direction on the side internal to the outline of each dot-shaped recess 3. Thus, the same effect as that described in the first embodiment can be obtained.

Third Embodiment

In the first embodiment, as shown in FIG. 2, dot-shaped recesses 3 are adjacent to each other so as to circumscribe each other; however, dot-shaped recesses 3 may be separated from each other. Even when dot-shaped recesses 3 are separated from each other, the following configuration is possible: a collection of the plurality of dot-shaped recesses 3 form a marking as a whole.

Figure 11:
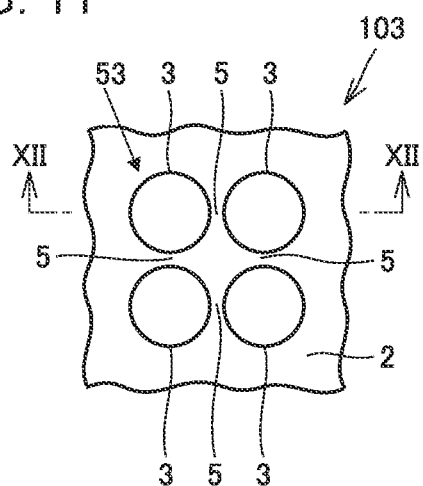
FIG. 11 is an enlarged plan view of a marking and a vicinity thereof in an electronic component according to a third embodiment of the present disclosure.
Figure 12:
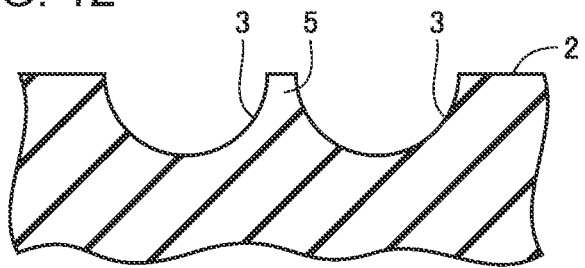
FIG. 12 is a cross sectional view taken along a line XII-XII in FIG. 11.

An electronic component according to a third embodiment of the present disclosure will be described with reference to FIGS. 11 to 12. FIG. 11 shows a marking 53 and a vicinity thereof in an electronic component 103 according to the present embodiment in an enlarged manner. FIG. 12 is a cross sectional view taken along a line XII-XII in FIG. 11. Marking 53 is formed as a collection of four dot-shaped recesses 3. Four dot-shaped recesses 3 are separated from each other, but are close to each other to such an extent that they can be regarded as one unified marking 53 as a whole. A wall-shaped portion 5 is formed between dot-shaped recesses 3. The other configurations are the same as those described in the first embodiment, and therefore will not be described repeatedly.

In the present embodiment, the plurality of dot-shaped recesses 3 that form marking 53 are separated from each other; however, since the region internal to the outline of each of the plurality of dot-shaped recesses 3 is entirely non-flat, light having been emitted toward marking 53 in the direction perpendicular to first surface 2 in order to read marking 53 is reflected in a direction different from the incident direction on the side internal to the outline of each dot-shaped recess 3. Thus, the same effect as that described in the first embodiment can be obtained.

Figure 13:
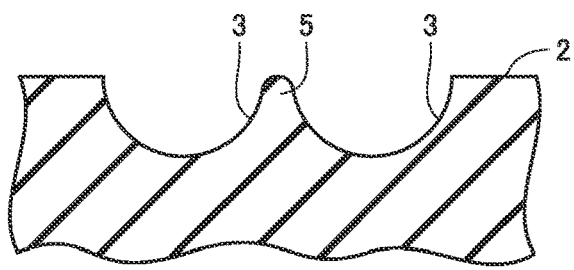
FIG. 13 is a cross sectional view showing a state in which a wall-shaped portion is further chamfered by barrel polishing from the state shown in FIG. 12.

Further, in the case where barrel polishing is performed on electronic component 103 in order to chamfer a corner portion of electronic component 103, since wall-shaped portion 5 is formed in the form of a lattice, there is a high probability that wall-shaped portion 5 is not completely collapsed or completely fractured and broken even when a medium for barrel polishing collides with wall-shaped portion 5. Rather, as illustrated in FIG. 13, wall-shaped portion 5 can be appropriately chamfered to reduce a flat portion of wall-shaped portion 5. This results in a reduced amount of light returning toward the reading device. As a result, the contrast of reflected light can be further improved. That is, it is possible to conceive a configuration in which one or more second regions are provided internal to outline 9 of marking 53 when viewed in the direction perpendicular to first surface 2, each of the one or more second regions not belonging to any of the plurality of dot-shaped recesses 3, each of the one or more second regions being chamfered, each of the one or more second regions being non-flat, and this configuration is preferable in that the contrast of reflected light is further improved. In the example shown in FIG. 13, the chamfered portion of wall-shaped portion 5 corresponds to the "second region".

It should be noted that the "medium" used in the barrel polishing may be also referred to as a "ball stone".

Fourth Embodiment

Figure 14:
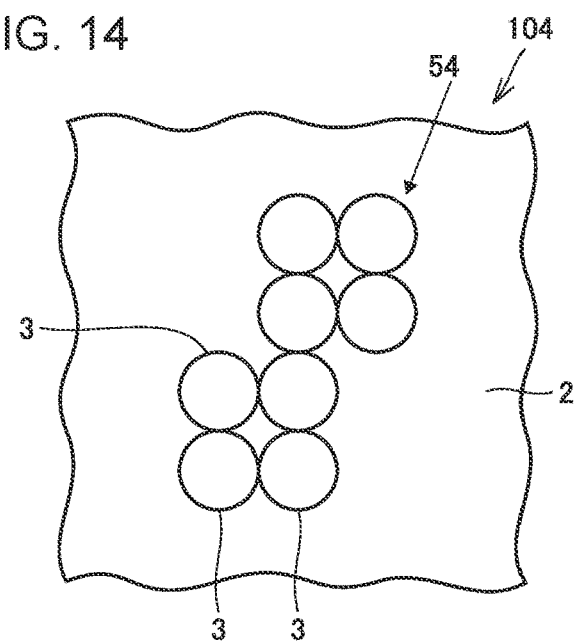
FIG. 14 is an enlarged plan view of a marking and a vicinity thereof in an electronic component according to a fourth embodiment of the present disclosure.

An electronic component according to a fourth embodiment of the present disclosure will be described with reference to FIG. 14. FIG. 14 shows a marking 54 and a vicinity thereof in an electronic component 104 according to the present embodiment in an enlarged manner. In first surface 2, marking 54 is formed by a collection of a plurality of dot-shaped recesses 3. Marking 54 is formed to have a shape that is not a square. In marking 54, the number of dot-shaped recesses 3 arranged longitudinally and the number of dot-shaped recesses 3 arranged laterally are different. The other configurations are the same as those described in the first embodiment, and therefore will not be described repeatedly.

Also in the present embodiment, the same effect as that described in the first embodiment can be obtained.

Fifth Embodiment (Configuration)

Figure 15:
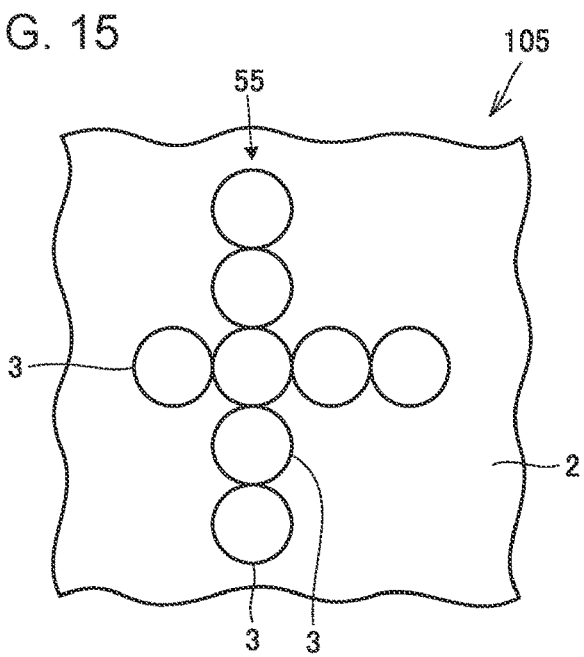
FIG. 15 is an enlarged plan view of a marking and a vicinity thereof in an electronic component according to a fifth embodiment of the present disclosure.

An electronic component according to a fifth embodiment of the present disclosure will be described with reference to FIG. 15. FIG. 15 shows a marking 55 and a vicinity thereof in an electronic component 105 according to the present embodiment in an enlarged manner. In first surface 2, marking 55 is formed by a collection of a plurality of dot-shaped recesses 3. Marking 55 is formed to have a cross shape. In other words, marking 55 is formed such that the arrangement of dot-shaped recesses 3 in the longitudinal direction and the arrangement of dot-shaped recesses 3 in the lateral direction intersect with each other. The other configurations are the same as those described in the first embodiment, and therefore will not be described repeatedly.

(Function and Effect)

Also in the present embodiment, the same effect as that described in the first embodiment can be obtained.

Sixth Embodiment

Figure 16:
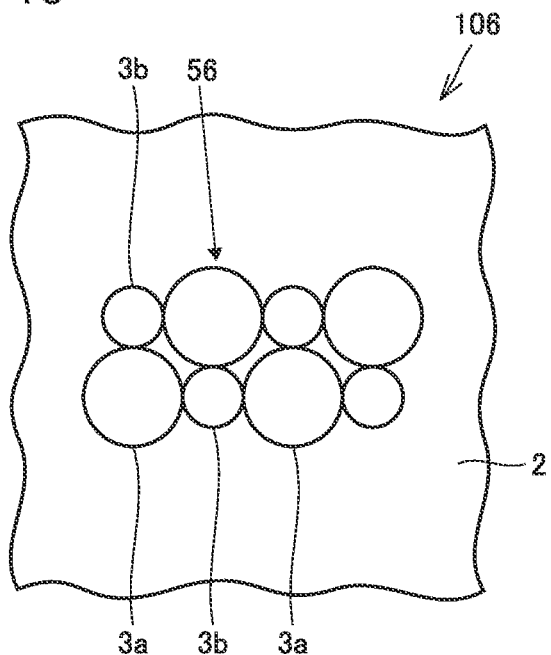
FIG. 16 is an enlarged plan view of a marking and a vicinity thereof in an electronic component according to a sixth embodiment of the present disclosure.

An electronic component according to a sixth embodiment of the present disclosure will be described with reference to FIG. 16. FIG. 16 shows a marking 56 and a vicinity thereof in an electronic component 106 according to the present embodiment in an enlarged manner. In first surface 2, marking 56 is formed by a collection of a plurality of dot-shaped recesses. The plurality of dot-shaped recesses herein include two types of dot-shaped recesses different in size. That is, the plurality of dot-shaped recesses include: dot-shaped recesses 3a each having a large size; and dot-shaped recesses 3b each having a small size. Although it is illustratively described here that the two types of dot-shaped recesses different in size are present in one marking, three or more types of dot-shaped recesses different in size may be present in one marking. The other configurations are the same as those described in the first embodiment, and therefore will not be described repeatedly.

Also in the present embodiment, the same effect as that described in the first embodiment can be obtained.

Seventh Embodiment

Figure 17:
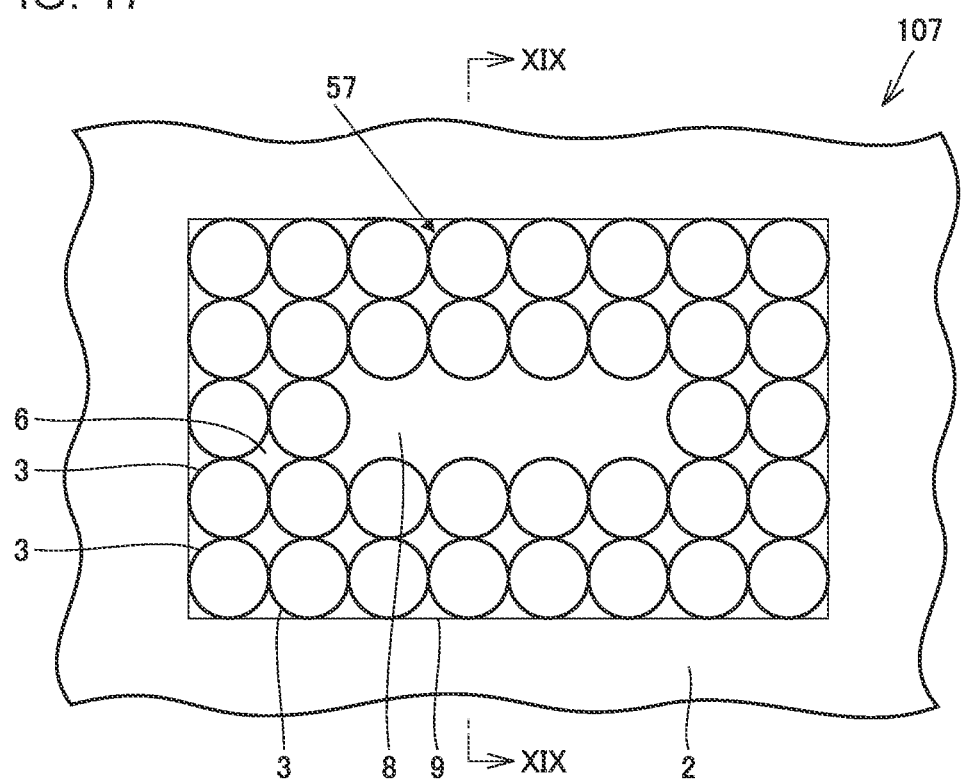
FIG. 17 is an enlarged plan view of a marking and a vicinity thereof in an electronic component according to a seventh embodiment of the present disclosure.
Figure 18:
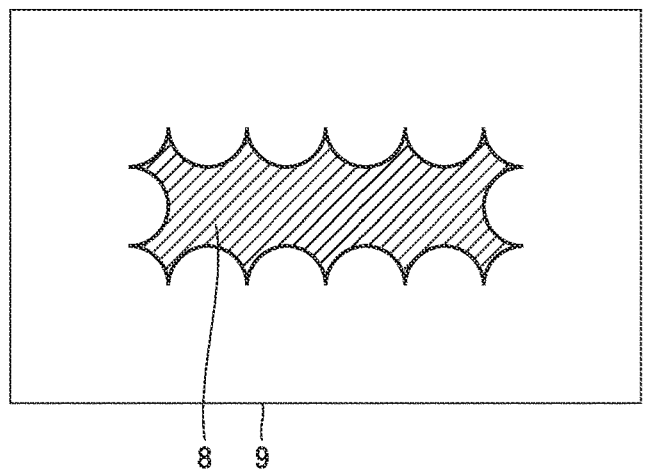
FIG. 18 is an explanatory diagram of an outline of a marking and a first region in an electronic component according to a seventh embodiment of the present disclosure.
Figure 19:
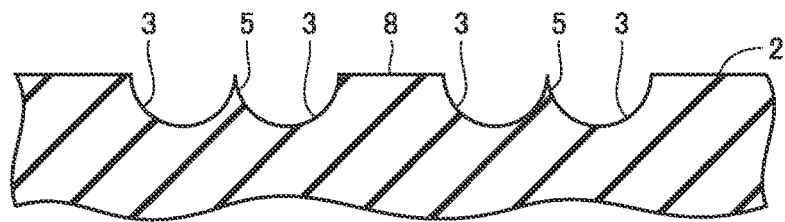
FIG. 19 is a cross sectional view taken along a line XIX-XIX in FIG. 17.

An electronic component according to a seventh embodiment of the present disclosure will be described with reference to FIGS. 17 to 19. FIG. 17 shows a marking 57 and a vicinity thereof in an electronic component 107 according to the present embodiment in an enlarged manner. In first surface 2, marking 57 is formed by a collection of a plurality of dot-shaped recesses 3. Electronic component 107 has one or more first regions 8 internal to an outline 9 of marking 57 when viewed in a direction perpendicular to first surface 2, each of one or more first regions 8 not belonging to any of the plurality of dot-shaped recesses 3, each of one or more first regions 8 being flat. FIG. 18 shows outline 9 of marking 57 and first region 8 in FIG. 17 in a more clarified manner. In this figure, a portion provided with hatching is first region 8. Dot-shaped recesses 3 are formed by laser processing, whereas first region 8 is a region having not been subjected to the laser processing. First region 8 has a flat surface having the same height as unprocessed first surface 2. Outline 9 is a line surrounding marking 57 so as to circumscribe the outermost ones of dot-shaped recesses 3 belonging to marking 57. FIG. 19 is a cross sectional view taken along a line XIX-XIX in FIG. 17. The plurality of dot-shaped recesses 3 are arranged to surround first region 8 in two rows.

Also in the present embodiment, the same effect as that described in the first embodiment can be obtained. Further, when barrel polishing is performed on electronic component 107 in order to chamfer a corner portion of electronic component 107, since one or more flat first regions 8 not belonging to any of the plurality of dot-shaped recesses 3 are present internal to outline 9 of marking 57 in electronic component 107, the medium for barrel polishing does not completely collapse first region 8 even when the medium collides with first regions 8. Since the collision of the medium with plateau portion 6 is suppressed by first region 8, the same structure as that shown in FIG. 17 can be maintained in electronic component 107 even after the barrel polishing. Since the medium collides with plateau portion 6 although the collision of the medium with plateau portion 6 is suppressed, plateau portion 6 is appropriately chamfered, with the result that the flat portion of plateau portion 6 can be reduced. This results in a reduced amount of light returning toward the reading device. Therefore, the contrast of reflected light can be further improved.

Figure 20:
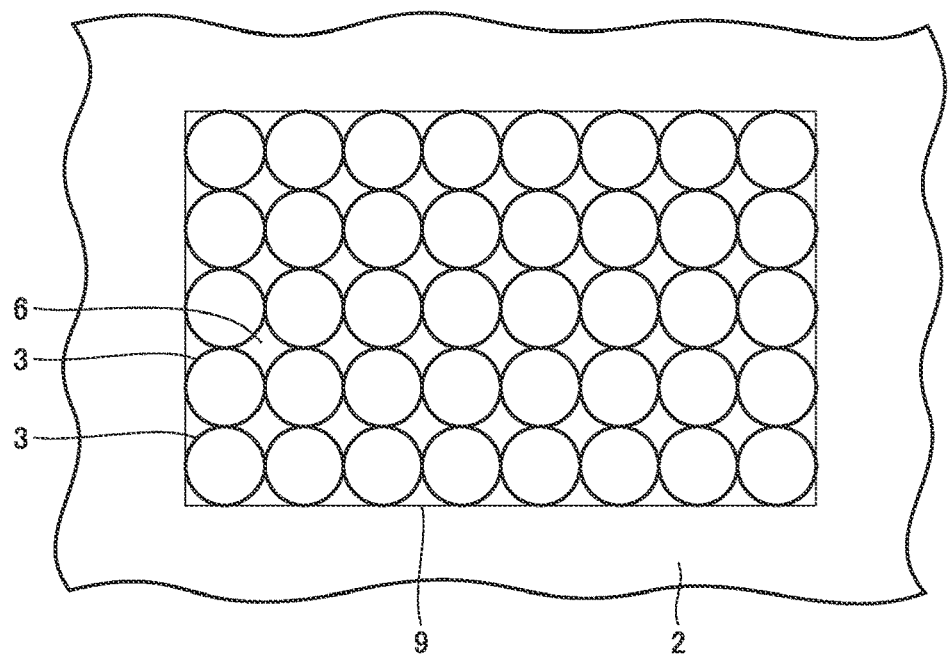
FIG. 20 is an explanatory diagram of a state before barrel polishing in a comparative example shown in the seventh embodiment.
Figure 21:
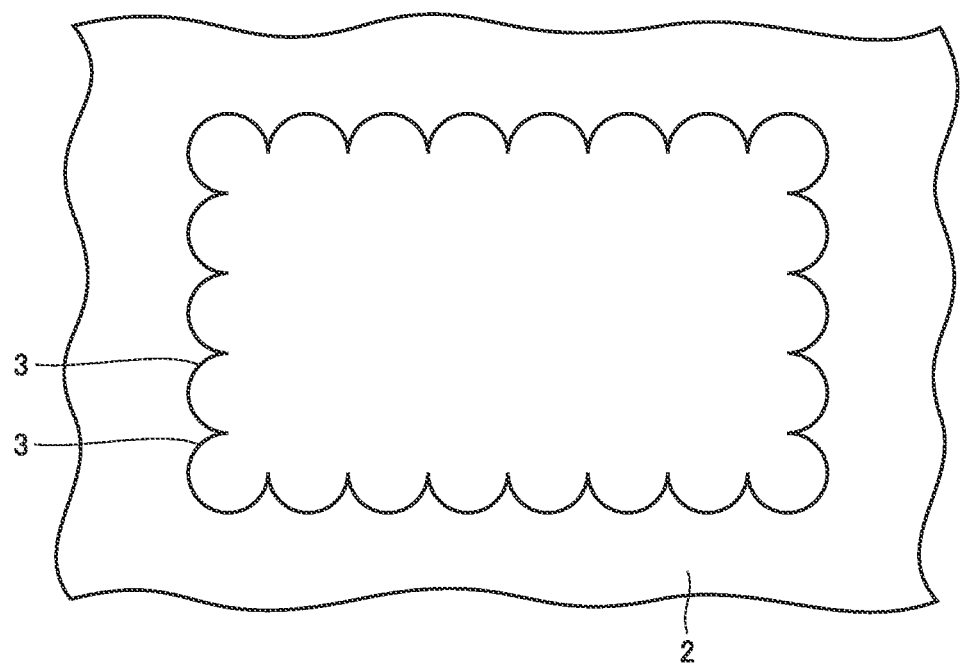
FIG. 21 is an explanatory diagram of a state after the barrel polishing in the comparative example shown in the seventh embodiment.

If no first region 8 is provided, a situation as shown in FIG. 20 is considered at a stage before the barrel polishing. That is, in this case, a multiplicity of plateau portions 6 are arranged internal to outline 9 of the marking. Since each of plateau portions 6 is thin, plateau portion 6 is readily collapsed when the medium for barrel polishing collides with plateau portion 6. As a result of performing the barrel polishing on the electronic component having this configuration, the whole of plateau portions 6 is collapsed on the side internal to the marking as shown in FIG. 21. In that case, a wide range of the center portion of the marking becomes flat, with the result that the emitted light is reflected at this flat portion in the incoming direction. Therefore, the contrast of reflected light when the marking is irradiated with the light for reading cannot be sufficiently secured. However, since first region 8 is present in electronic component 107 according to the present embodiment, the state shown in FIG. 21 can be avoided.

It should be noted that as shown in the present embodiment, first region 8 is preferably surrounded by at least some of the plurality of dot-shaped recesses 3. By employing this configuration, the size of the marking can be secured to be large.

As shown in the present embodiment, first region 8 is preferably disposed at the center portion of marking 57. By employing this configuration, entry of the medium for barrel polishing can be efficiently prevented by first region 8.

(Manufacturing Method)

An exemplary method of manufacturing the electronic component according to the present embodiment will be described.

First, a green sheet composed of a low temperature co-fired ceramic (LTCC) is produced. Via holes are formed in the green sheet. The via holes are filled with a conductive paste. A conductive pattern is formed on a surface of the green sheet by printing using the conductive paste. The green sheet having been through the above steps is layered to form a ceramic block. On this occasion, the ceramic block is produced to have a large size corresponding to a plurality of products, rather than the size of an individual product. The obtained ceramic block is placed in a mold and is compressed.

A marking is formed in a surface of the compressed ceramic block. In order to form the marking, a method such as laser processing, mold processing, or dissolution using a solvent, can be used. The marking is formed by forming dot-shaped recesses using any of these methods. Alternatively, the dot-shaped recesses may be formed by depressing it through press working.

The ceramic block is cut into the size of an individual product. For this purpose, a method such as dicer processing, guillotine cutting, or laser processing can be used. A piece obtained by dividing the ceramic block into the size of an individual product is hereinafter referred to as a "chip". The obtained chip is subjected to barrel polishing as necessary.

Plating necessary for the chip is performed. The plating performed here may be any of Ni—Sn plating, Ni-electroless Au plating, or the like.

Barrel polishing is performed to flatten a protrusion resulting from the plating. Specifically, the chip having been plated and a medium are placed in a pot of a rotary type barrel polishing apparatus. Examples of the medium usable herein include a medium composed of zirconia, alumina, or the like. The diameter of the medium may be, for example, 2 mm or more and 5 mm or less. An amount of flattening can be adjusted by a rotation speed of the barrel and a processing time. The rotation speed may be, for example, 50 rpm or more and 200 rpm or less. The processing time may be, for example, 5 minutes or more and 30 minutes or less. In the barrel polishing, impact force is weaker than that in shot blasting, so that the chip can be less damaged. Vibration type barrel polishing may be used instead of the rotary type barrel polishing. By this barrel polishing, an end portion resulting from the plating is made obtuse. By this barrel polishing, the thickness of the plating can be thin.

The chips having been through these processes are arranged on a tray for sputtering, and sputtering deposition is performed. Thus, the product of the electronic component is obtained. The product is subjected to cleaning, printing, measurement, and appearance inspection. During the appearance inspection, the orientation of the product is aligned by identifying the marking in the surface thereof. A product determined as a non-defective product in the appearance inspection is packaged and shipped.

Here, the explanation has been made for the method of manufacturing the electronic component according to the seventh embodiment; however, this manufacturing method can be also used for the electronic components according to the other embodiments.

Eighth Embodiment

Figure 22:
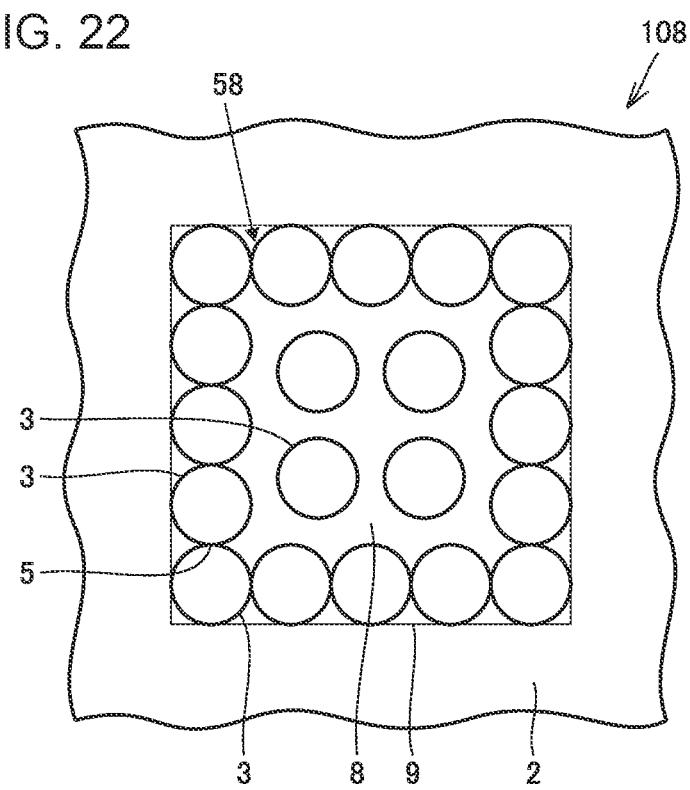
FIG. 22 is an enlarged plan view of a marking and a vicinity thereof in an electronic component according to an eighth embodiment of the present disclosure.

Referring to FIG. 22, an electronic component according to an eighth embodiment of the present disclosure will be described. FIG. 22 shows a marking 58 and a vicinity thereof in an electronic component 108 according to the present embodiment in an enlarged manner. In first surface 2, marking 58 is formed by a collection of a plurality of dot-shaped recesses 3. Electronic component 108 has one or more first regions 8 internal to outline 9 of marking 58 when viewed in a direction perpendicular to first surface 2, each of one or more first regions 8 not belonging to any of the plurality of dot-shaped recesses 3, each of one or more first regions 8 being flat. In this example, a margin-like portion around four dot-shaped recesses 3 arranged at the center is first region 8.

Figure 23:
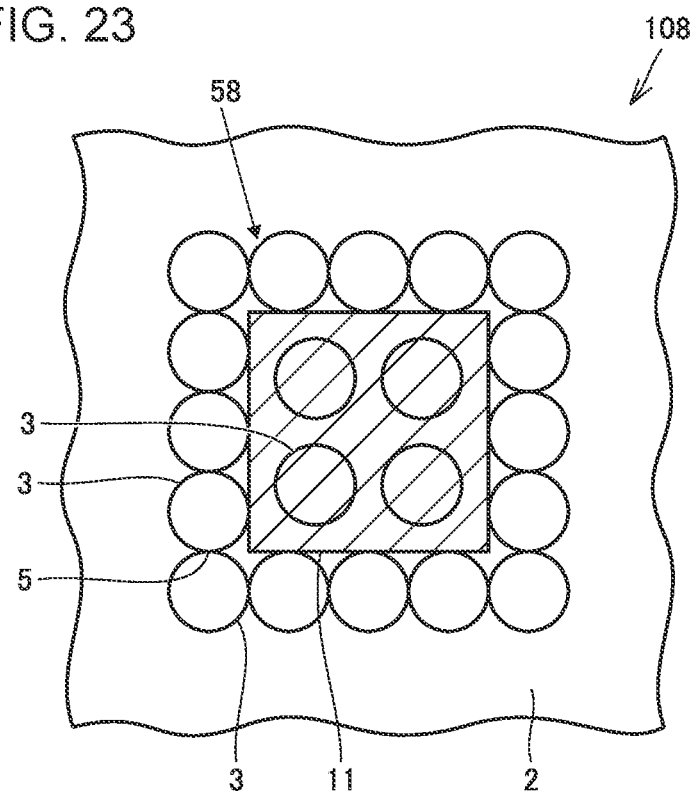
FIG. 23 is an explanatory diagram of the marking of the electronic component according to the eighth embodiment of the present disclosure.

Also in the present embodiment, the same effect as that described in the seventh embodiment can be obtained. As shown in FIG. 23, a region 11 provided with hatching at the center portion of marking 58 is a region in which the medium is less likely to enter even in the barrel polishing. Since dot-shaped recesses 3 in one row surrounding region 11 are thin in width in the first place, each of dot-shaped recesses 3 is a region in each of which the medium is less likely to enter and which is less likely to be collapsed even in the barrel polishing. Therefore, marking 58 is less likely to be collapsed in electronic component 108 even when the barrel polishing is performed.

Ninth Embodiment

Figure 24:
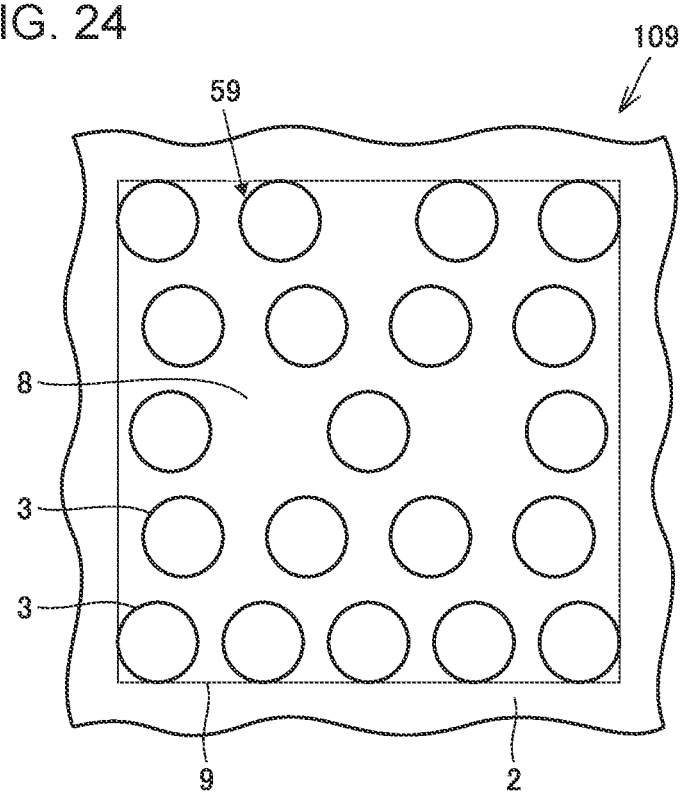
FIG. 24 is an enlarged plan view of a marking and a vicinity thereof in an electronic component according to a ninth embodiment of the present disclosure.

An electronic component according to a ninth embodiment of the present disclosure will be described with reference to FIG. 24. FIG. 24 shows a marking 59 and a vicinity thereof in an electronic component 109 according to the present embodiment in an enlarged manner. In first surface 2, marking 59 is formed by a collection of a plurality of dot-shaped recesses 3. In this example, first region 8 is not completely surrounded by the plurality of dot-shaped recesses 3. First region 8 is connected to outline 9.

The other configurations are the same as those described above, and therefore will not be described repeatedly.

Also in the present embodiment, the same effect as that described in the seventh embodiment can be obtained.

Tenth Embodiment

Figure 25:
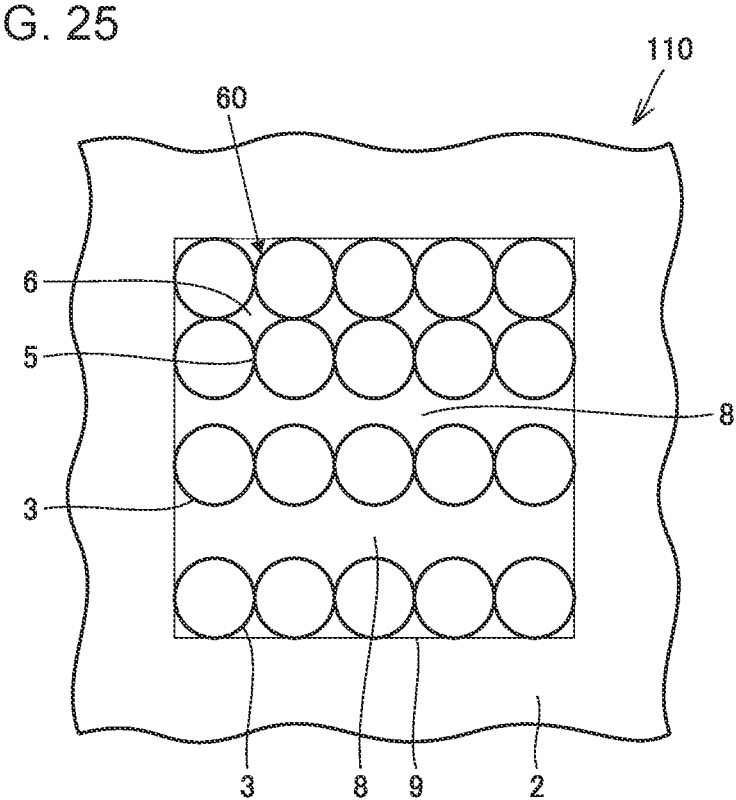
FIG. 25 is an enlarged plan view of a marking and a vicinity thereof in an electronic component according to a tenth embodiment of the present disclosure.

An electronic component according to a tenth embodiment of the present disclosure will be described with reference to FIG. 25. FIG. 25 shows a marking 60 and a vicinity thereof in an electronic component 110 according to the present embodiment in an enlarged manner. In first surface 2, marking 60 is formed by a collection of a plurality of dot-shaped recesses 3. In this example, first region 8 is not completely surrounded by the plurality of dot-shaped recesses 3. Also in this example, first region 8 is connected to outline 9. Thus, first region 8 may be divided into a plurality of regions in one marking 60. Marking 60 is separated into three parts by first region 8.

The other configurations are the same as those described above, and therefore will not be described repeatedly.

Also in the present embodiment, the same effect as that described in the seventh embodiment can be obtained.

Eleventh Embodiment

Figure 26:
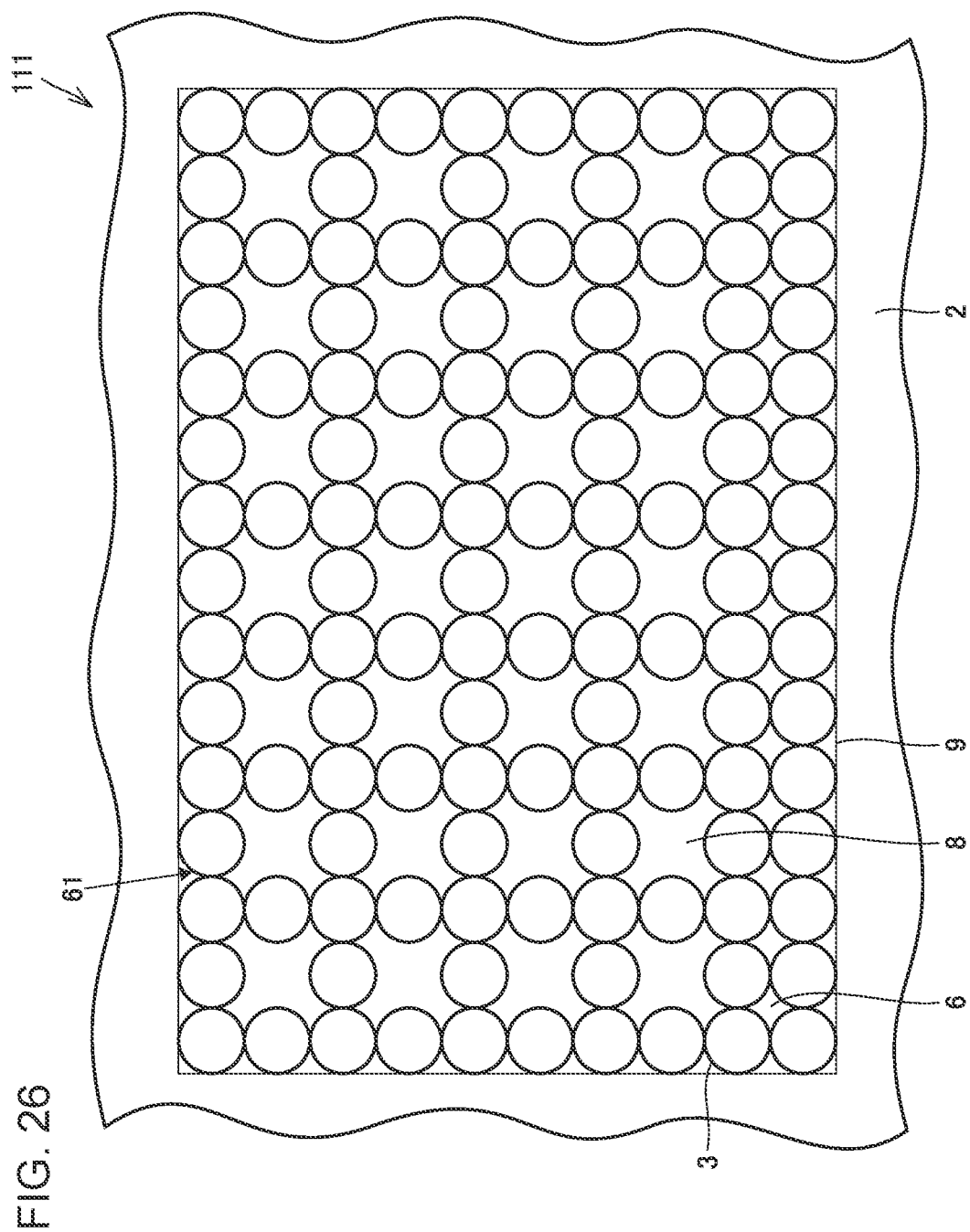
FIG. 26 is an enlarged plan view of a marking and a vicinity thereof in an electronic component according to an eleventh embodiment of the present disclosure.

An electronic component according to an eleventh embodiment of the present disclosure will be described with reference to FIG. 26. FIG. 26 shows a marking 61 and a vicinity thereof in an electronic component 111 according to the present embodiment in an enlarged manner. In first surface 2, marking 61 is formed by a collection of a plurality of dot-shaped recesses 3. In this example, a plurality of first regions 8 are present in one marking 61.

The other configurations are the same as those described above, and therefore will not be described repeatedly.

Also in the present embodiment, the same effect as that described in the seventh embodiment can be obtained.

Twelfth Embodiment

Figure 27:
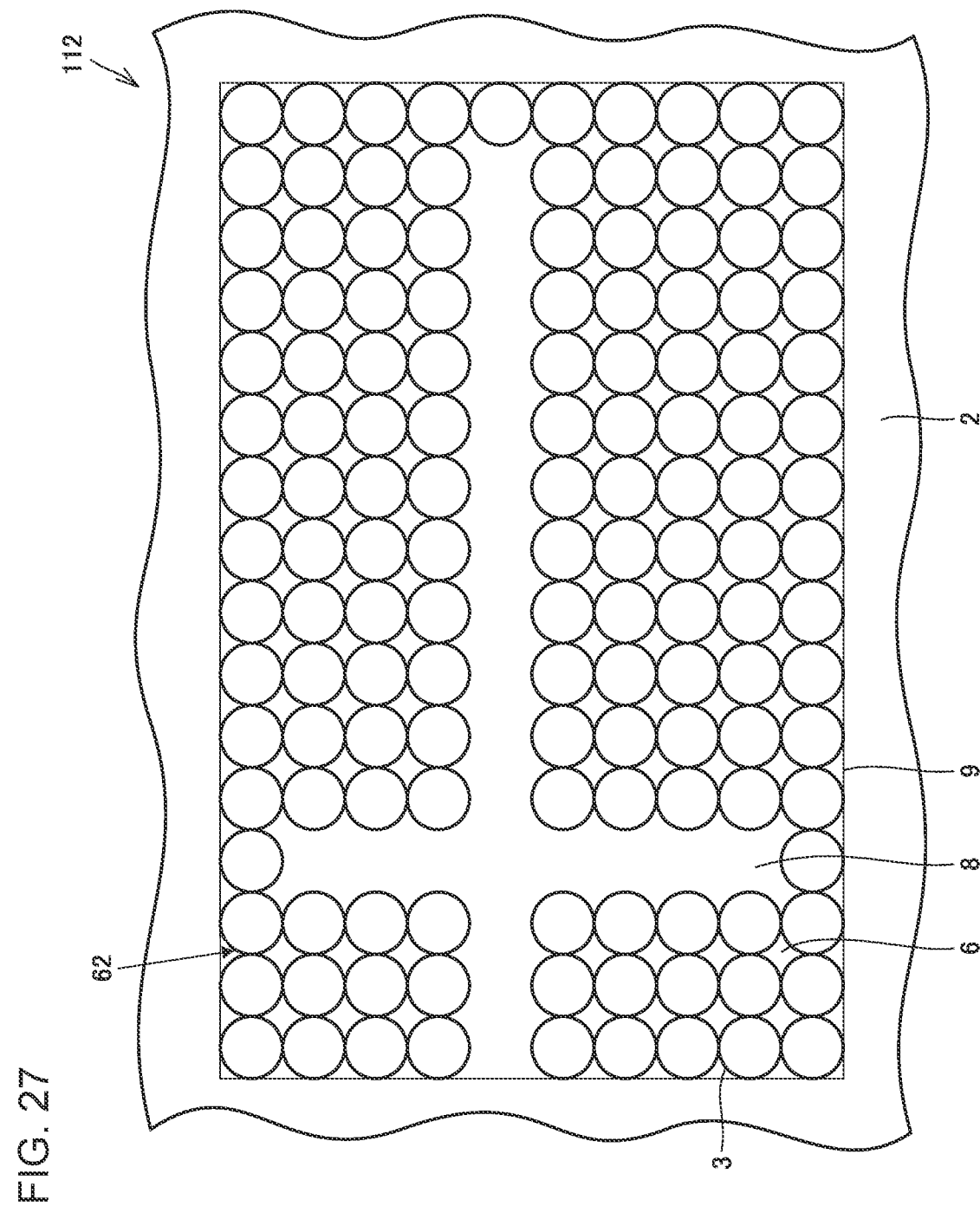
FIG. 27 is an enlarged plan view of a marking and a vicinity thereof in an electronic component according to a twelfth embodiment of the present disclosure.

An electronic component according to a twelfth embodiment of the present disclosure will be described with reference to FIG. 27. FIG. 27 shows a marking 62 and a vicinity thereof in an electronic component 112 according to the present embodiment in an enlarged manner. In first surface 2, marking 62 is formed by a collection of a plurality of dot-shaped recesses 3. In this example, a first region 8 having a cross shape is present in marking 62.

The other configurations are the same as those described above, and therefore will not be described repeatedly.

Also in the present embodiment, the same effect as that described in the first embodiment can be obtained.

Thirteenth Embodiment

Figure 28:
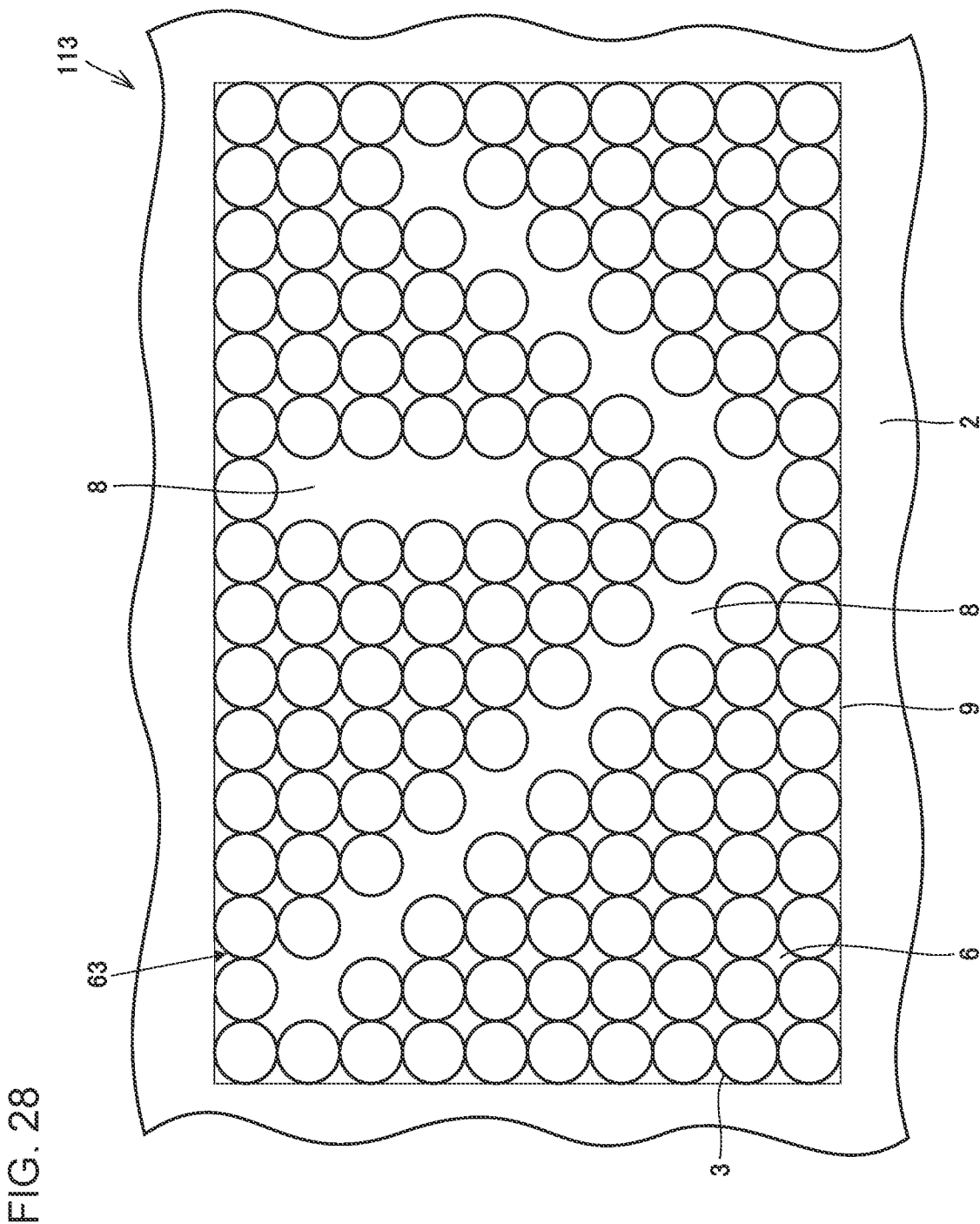
FIG. 28 is an enlarged plan view of a marking and a vicinity thereof in an electronic component according to a thirteenth embodiment of the present disclosure.

An electronic component according to a thirteenth embodiment of the present disclosure will be described with reference to FIG. 28. FIG. 28 shows a marking 63 and a vicinity thereof in an electronic component 113 according to the present embodiment in an enlarged manner. In first surface 2, marking 63 is formed by a collection of a plurality of dot-shaped recesses 3. In this example, a first region 8 having a V shape and a first region 8 having a straight line are present in marking 63.

The other configurations are the same as those described above, and therefore will not be described repeatedly.

Also in the present embodiment, the same effect as that described in the first embodiment can be obtained.

Fourteenth Embodiment

Figure 29:
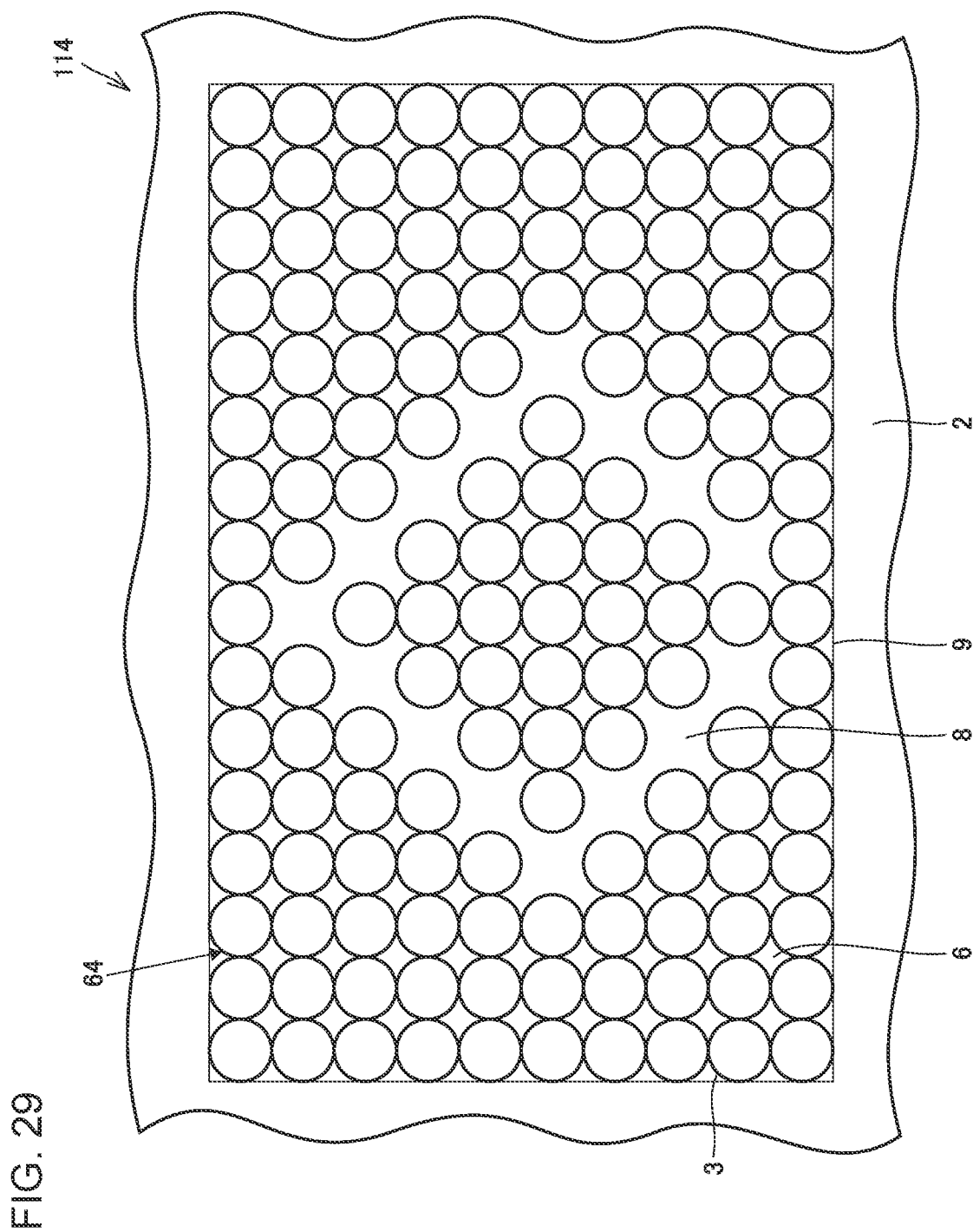
FIG. 29 is an enlarged plan view of a marking and a vicinity thereof in an electronic component according to a fourteenth embodiment of the present disclosure.

An electronic component according to a fourteenth embodiment of the present disclosure will be described with reference to FIG. 29. FIG. 29 shows a marking 64 and a vicinity thereof in an electronic component 114 according to the present embodiment in an enlarged manner. In first surface 2, marking 64 is formed by a collection of a plurality of dot-shaped recesses 3. In this example, a first region 8 having a C shape is present in marking 64.

The other configurations are the same as those described above, and therefore will not be described repeatedly.

Also in the present embodiment, the same effect as that described in the first embodiment can be obtained.

Fifteenth Embodiment

Figure 30:
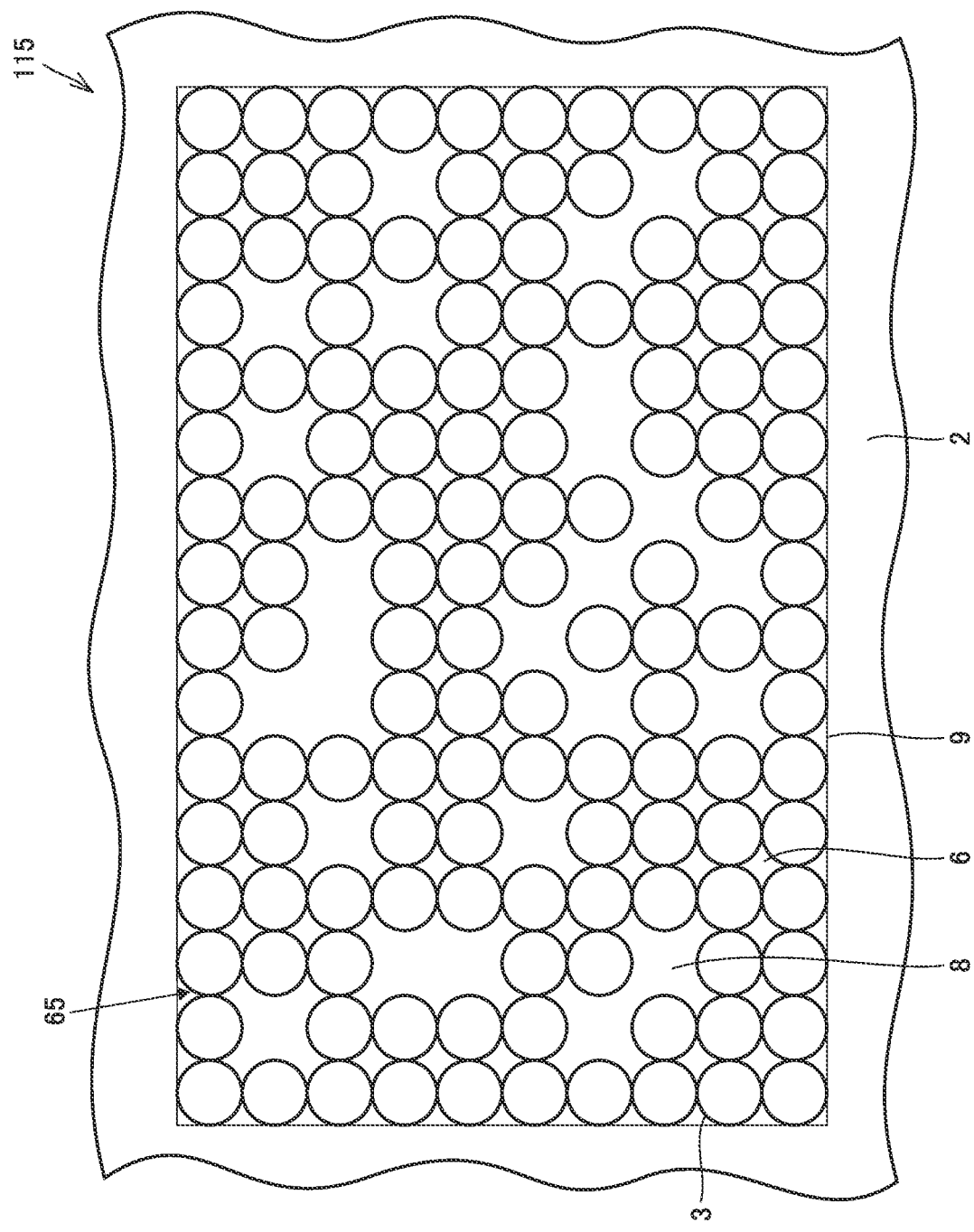
FIG. 30 is an enlarged plan view of a marking and a vicinity thereof in an electronic component according to a fifteenth embodiment of the present disclosure.

An electronic component according to a fifteenth embodiment of the present disclosure will be described with reference to FIG. 30. FIG. 30 shows a marking 65 and a vicinity thereof in an electronic component 115 according to the present embodiment in an enlarged manner. In first surface 2, marking 65 is formed by a collection of a plurality of dot-shaped recesses 3. In this example, some first regions 8 are present in marking 65.

The other configurations are the same as those described above, and therefore will not be described repeatedly.

Also in the present embodiment, the same effect as that described in the seventh embodiment can be obtained.

Sixteenth Embodiment

Figure 31:
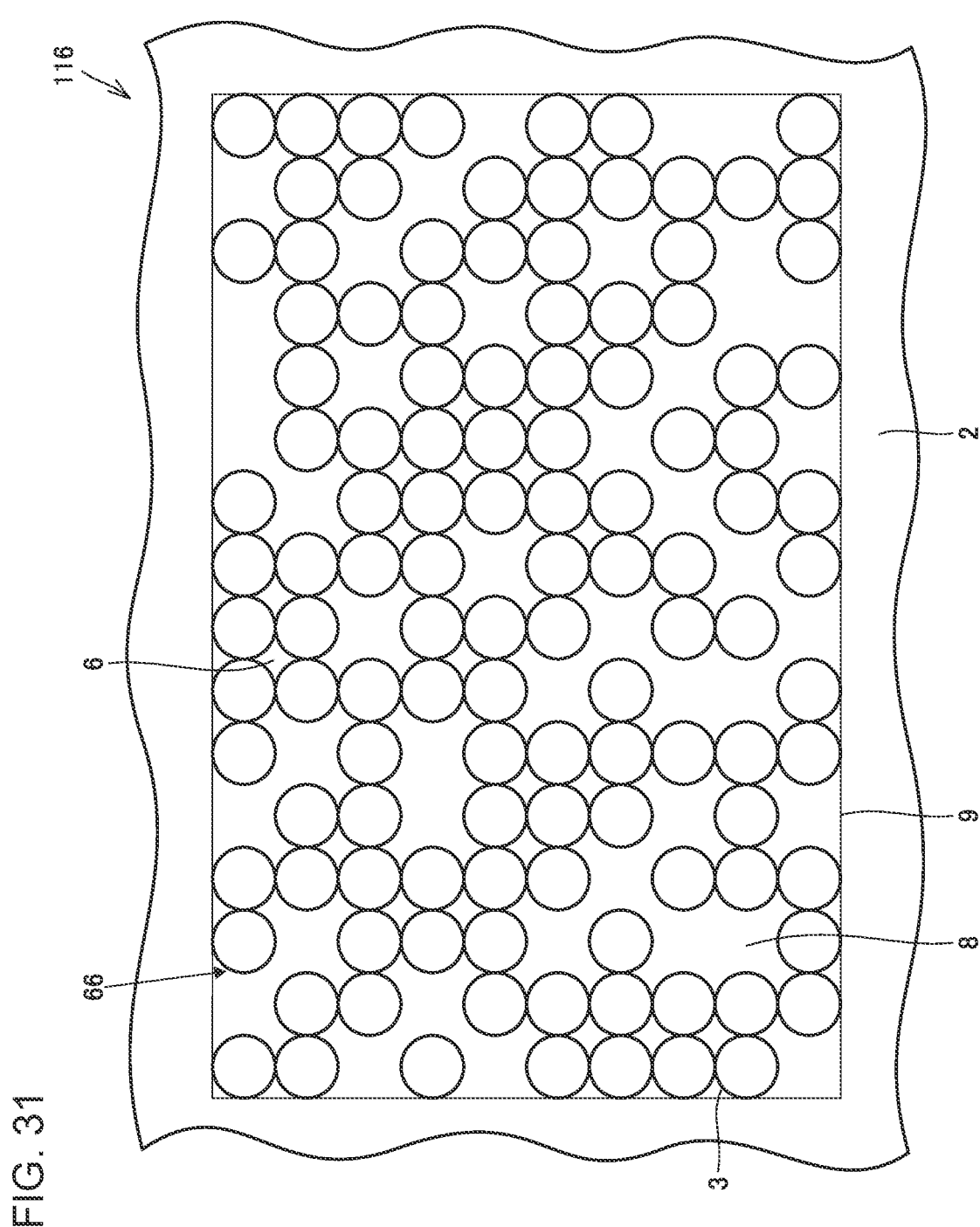
FIG. 31 is an enlarged plan view of a marking and a vicinity thereof in an electronic component according to a sixteenth embodiment of the present disclosure.

An electronic component according to a sixteenth embodiment of the present disclosure will be described with reference to FIG. 31. FIG. 31 shows a marking 66 and a vicinity thereof in an electronic component 116 according to the present embodiment in an enlarged manner. In first surface 2, marking 66 is formed by a collection of a plurality of dot-shaped recesses 3. In this example, some first regions 8 are present in marking 66. Some of these first regions 8 are connected to outline 9.

The other configurations are the same as those described above, and therefore will not be described repeatedly.

Also in the present embodiment, the same effect as that described in the seventh embodiment can be obtained.

It should be noted that in each of the above-described embodiments, each of dot-shaped recesses 3 is shown as having a semicircular shape when viewed in a cross sectional view; however, this is just an example and the shape is not limited to an exact semicircular shape. Dot-shaped recess 3 may have, for example, a shape obtained by halving an ellipsoidal shape when viewed in a cross sectional view.

It should be noted that a plurality of embodiments of the above embodiments may be appropriately combined and employed.

It should be noted that the embodiments disclosed herein are by way of illustration and example only and are not to be taken by way of limitation. The scope of the present disclosure is defined by the terms of the claims, and is intended to include any modifications within the scope and meaning equivalent to the terms of the claims.

2: first surface; 3: dot-shaped recess; 4: region (irradiated with laser light); 5: wall-shaped portion; 6: plateau portion; 7: mountain portion; 8: first surface; 9: outline; 11: region; 51, 52, 53, 54, 55, 56, 57, 58, 59, 60, 61, 62, 63, 64, 65, 66: marking; 101, 102, 103, 104, 105, 106, 107, 108, 109, 110, 111, 112, 113, 114, 115, 116: electronic component.

The invention claimed is:

1. An electronic component comprising a first surface, wherein
a marking comprising a collection of a plurality of dot-shaped recesses is provided on the first surface,
an inner surface of each of the plurality of dot-shaped recesses is a curved surface,
when viewed in a direction perpendicular to the first surface, a region internal to an outline of each of the plurality of dot-shaped recesses is entirely non-flat,
the electric component further comprises one or more second regions internal to an outline of the marking when viewed in the direction perpendicular to the first surface, each of the one or more second regions not belonging to any of the plurality of dot-shaped recesses, each of the one or more second regions being chamfered, each of the one or more second regions being non-flat, and
each of the one or more second regions is convex.

2. The electronic component according to claim 1, further comprising one or more first regions internal to an outline of the marking when viewed in the direction perpendicular to the first surface, each of the one or more first regions not belonging to any of the plurality of dot-shaped recesses, each of the one or more first regions being flat.

3. The electronic component according to claim 2, wherein the first region is surrounded by at least some of the plurality of dot-shaped recesses.

4. The electronic component according to claim 3, wherein the first region is disposed at a center portion of the marking.

5. The electronic component according to claim 3, wherein the plurality of dot-shaped recesses are arranged such that two or more dot-shaped recesses are arranged in a first direction and another two or more dot-shaped recesses are arranged in a second direction perpendicular to the first direction.

6. The electronic component according to claim 2, wherein the first region is disposed at a center portion of the marking.

7. The electronic component according to claim 6, wherein the plurality of dot-shaped recesses are arranged such that two or more dot-shaped recesses are arranged in a first direction and another two or more dot-shaped recesses are arranged in a second direction perpendicular to the first direction.

8. The electronic component according to claim 2, wherein the plurality of dot-shaped recesses are arranged such that two or more dot-shaped recesses are arranged in a first direction and another two or more dot-shaped recesses are arranged in a second direction perpendicular to the first direction.

9. The electronic component according to claim 1, wherein the plurality of dot-shaped recesses are arranged such that two or more dot-shaped recesses are arranged in a first direction and another two or more dot-shaped recesses are arranged in a second direction perpendicular to the first direction.

* * * * *